United States Patent
Lichtenau et al.

(10) Patent No.: US 7,681,153 B2
(45) Date of Patent: Mar. 16, 2010

(54) ESTIMATING STATIC POWER CONSUMPTION OF INTEGRATED CIRCUITS USING LOGIC GATE TEMPLATES

(75) Inventors: Cedric Lichtenau, Boeblingen (DE); Alberto Garcia-Ortiz, Stuttgart (DE); Norman J. Rohrer, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 546 days.

(21) Appl. No.: 11/626,020

(22) Filed: Jan. 23, 2007

(65) Prior Publication Data

US 2008/0177487 A1   Jul. 24, 2008

(51) Int. Cl.
*G06F 17/50* (2006.01)
(52) U.S. Cl. .............................. 716/4; 716/5
(58) Field of Classification Search ............ 716/4–5; 703/18
See application file for complete search history.

(56) References Cited

U.S. PATENT DOCUMENTS

| 5,847,966 | A | 12/1998 | Uchino et al. |
| 6,112,638 | A * | 9/2000 | Loechner .................. 91/363 A |
| 6,345,379 | B1 | 2/2002 | Khouja et al. |
| 2007/0244676 | A1 * | 10/2007 | Shang et al. ................... 703/2 |

* cited by examiner

*Primary Examiner*—Paul Dinh
(74) *Attorney, Agent, or Firm*—Ryan K. Simmons; Hoffman Warnick LLC

(57) ABSTRACT

A method, system and computer program product for estimating a static power consumption of an integrated circuit are disclosed. The static power consumption of a cell of the integrated circuit is characterized based on contributions of an input node(s) and an output node(s) of the cell. A contribution considers a leakage weight and a leakage probability of a node. A logic template of the cell may be created to better represent a contribution of an internal node to the static power consumption of the cell.

17 Claims, 3 Drawing Sheets

ESTIMATING STATIC POWER CONSUMPTION OF INTEGRATED CIRCUITS USING LOGIC GATE TEMPLATES

BACKGROUND OF THE INVENTION

1. Technical Field

This invention relates generally to integrated circuits, and more particularly to estimating the static power consumption of an integrated circuit.

2. Background Art

A static power consumption (also referred to as leakage) of an integrated circuit (IC) depends on the state of each cell of the IC. A cell may include any hierarchical level of IC components that are higher than a transistor, and may be represented as a netlist of gates. Full characterization of a cell regarding a static power consumption for a given voltage, temperature, and process-corner requires $2^n$ constants, where n is the number of inputs of the cell.

Conventionally, the estimation of the static power consumption of a netlist of gates (a cell) can be performed at two levels: gate level, where a gate is modeled as a black-box, or transistor level, where the internal logic of a gate is required. A transistor level estimation, e.g., with a SPICE simulation, provides a high degree of accuracy. However, the required simulation time may be prohibitively long for large integrated circuits. Some approaches based on a simplified transistor level model for leakage estimation have been proposed. Nevertheless, those approaches are still relatively slow, and require a detailed analysis of the physical sources of leakage present in a gate.

The state of the art approaches for leakage modeling and estimation at the gate level can be classified into three groups: constant approaches, table-based approaches and Boolean-condition based approaches. A constant approach models the static consumption as a single constant equal to the mean value of the measured leakages of the cell. This model does not consider any input dependency, and thus is very imprecise. In addition, it cannot be used for input dependent static power optimization techniques such as pin reordering, input vector control, etc.

A table-based approach models the static power consumption of each input state independently. The accuracy of this approach is the highest possible at this level of abstraction. However, the leakage estimation is very complicated and resource consuming, since this approach requires calculating independently the probabilities of all possible input states.

A Boolean-condition based approach basically neglects the smaller terms in the static power table of the table-based approach. The static power consumption is measured and modeled only for some input states. In the technologies where sub-threshold leakages dominate gate leakage, there are a small number of states with relatively high leakages. As such, this technique may allow a reduction in the sizes of the estimation tables, and a reduction in the number of internal Boolean expressions required to be calculated. However, this technique can be very imprecise in modern technologies with higher gate-leakage, and may also be very slow.

Based on the above, there is a need in the art for a solution to estimate the static power consumption of an integrated circuit, which satisfies simultaneously the requirements of accuracy, efficiency, and flexibility.

SUMMARY OF THE INVENTION

A method, system and computer program product for estimating a static power consumption of an integrated circuit are disclosed. The static power consumption of a cell of the integrated circuit is characterized based on contributions of an input node(s) and an output node(s) of the cell. A contribution considers a leakage weight and a leakage probability of a node. A logic template of the cell may be created to better represent a contribution of an internal node to the static power consumption of the cell.

A first aspect of the invention provides a method for estimating a static power consumption of an integrated circuit, the method comprising: dividing the integrated circuit into at least one cell; characterizing a static power consumption of a cell based on a contribution of an input node and a contribution of an output node of the cell, each contribution representing a multiplication of a leakage coefficient and a probability of a node; determining a value of a leakage coefficient of a node; determining a value of a probability of a node; and calculating a static power consumption of the cell to determine the static power consumption of the integrated circuit; wherein a leakage coefficient of a node is determined as a coordinate of an orthogonal projection of a vector representing the static power consumption of the cell into a base of vectors representing the input node, the output node and a constant.

A second aspect of the invention provides a system for estimating a static power consumption of an integrated circuit, the system comprising: means for dividing the integrated circuit into at least one cell; means for characterizing a static power consumption of a cell based on a contribution of an input node and a contribution of an output node of the cell, each contribution representing a multiplication of a leakage coefficient and a probability of a node; means for determining a value of a leakage coefficient of a node; means for determining a value of a probability of a node; and means for calculating a static power consumption of the cell to determine the static power consumption of the integrated circuit; wherein a leakage coefficient of a node is determined as a coordinate of an orthogonal projection of a vector representing the static power consumption of the cell into a base of vectors representing the input node, the output node and a constant.

A third aspect of the invention provides a computer program product comprising: computer usable program code which, when executed by a computer system, is configured to: divide an integrated circuit into at least one cell; characterize a static power consumption of a cell based on a contribution of an input node and a contribution of an output node of the cell, each contribution representing a multiplication of a leakage coefficient and a probability of a node; determine a value of a leakage coefficient of a node; determine a value of a probability of a node; and calculate a static power consumption of the cell to determine the static power consumption of the integrated circuit; wherein a leakage coefficient of a node is determined as a coordinate of an orthogonal projection of a vector representing the static power consumption of the cell into a base of vectors representing the input node, the output node and a constant.

The illustrative aspects of the present invention are designed to solve the problems herein described and/or other problems not discussed.

DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION

1. Computer System

Figure 1:
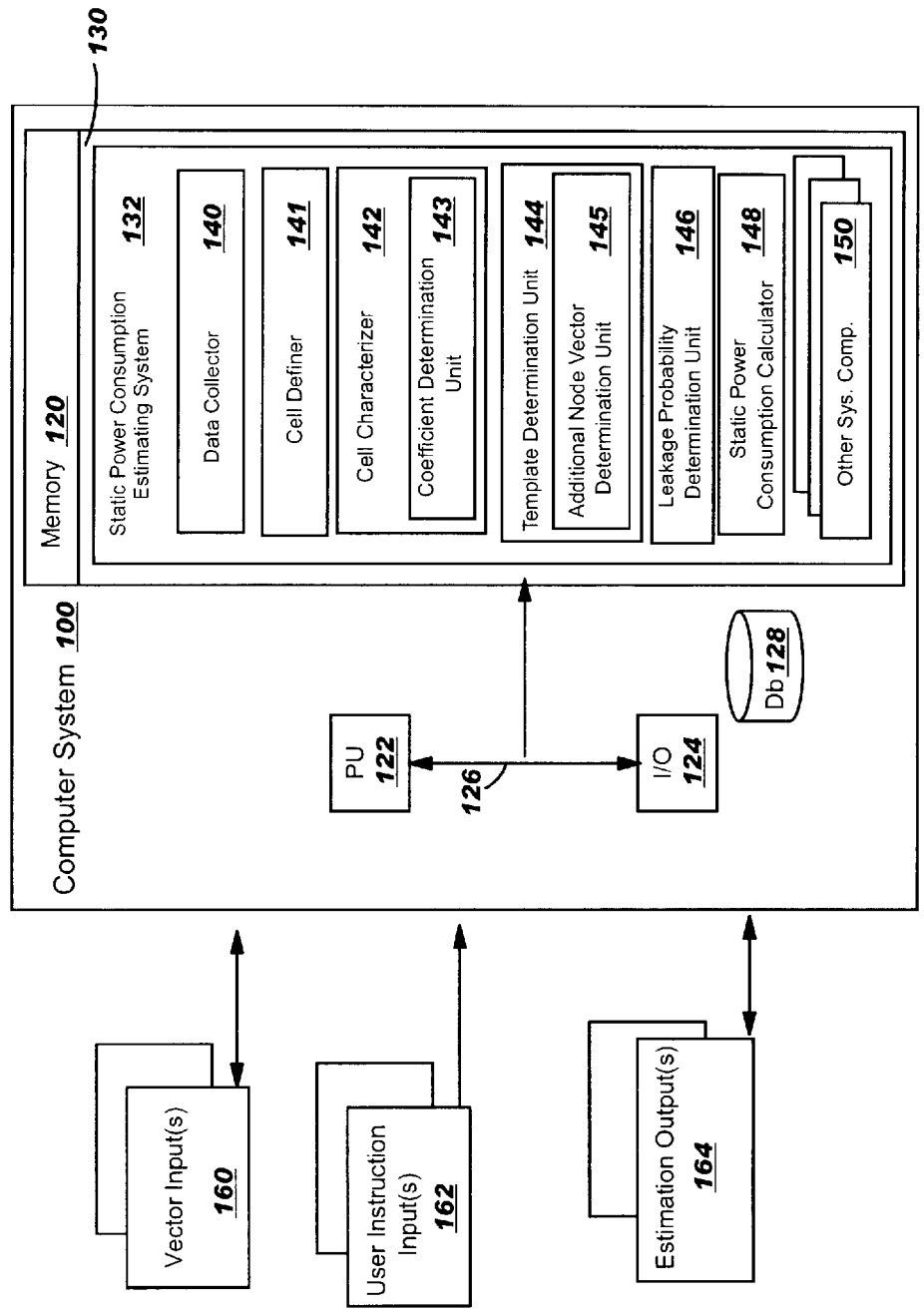
FIG. 1 shows a block diagram of an illustrative computer system according to one embodiment of the invention.

FIG. 1 shows a block diagram of an illustrative computer system 100 according to one embodiment of the invention. In one embodiment, computer system 100 includes a memory 120, a processing unit (PU) 122, input/output devices (I/O) 124 and a bus 126. A database 128 may also be provided for storage of data relative to processing tasks. Memory 120 includes a program product 130, which when executed by PU 122, comprises various functional capabilities described in further detail below. Memory 120 (and database 128) may comprise any known type of data storage system and/or transmission media, including magnetic media, optical media, random access memory (RAM), read only memory (ROM), a data object, etc. Moreover, memory 120 (and database 128) may reside at a single physical location comprising one or more types of data storage, or be distributed across a plurality of physical systems. PU 122 may likewise comprise a single processing unit, or a plurality of processing units distributed across one or more locations. I/O 124 may comprise any known type of input/output device including a network system, modem, keyboard, mouse, scanner, voice recognition system, CRT, printer, disc drives, etc. Additional components, such as cache memory, communication systems, system software, etc., may also be incorporated into computer system 100.

As shown in FIG. 1, program product 130 may include a static power consumption estimating system 132 that includes a data collector 140; a cell definer 141; a cell characterizer 142 including a coefficient determination unit 143; a template determination unit 144 including an additional node vector determination unit 145; a leakage probability determination unit 146; a static power consumption calculator 148; and other system components 150. Other system components 150 may include any now known or later developed parts of a computer system 100 not individually delineated herein, but understood by those skilled in the art.

Inputs to computer system 100 include vector inputs 160 and user instruction inputs 162. Vector inputs 160 include, for example, vectors of a cell regarding leakage dissipation that are obtained by, e.g., a SPICE simulation. User instruction inputs 162 include, for example, instructions of a user of computer system 100 regarding the operation of, inter alia, static power consumption estimating system 132. For example, a user may instruct template determination unit 144 regarding whether and how to replace a netlist with a logic template, as will be described below. In addition, a user may instruct how to define a cell within an integrated circuit. Outputs of computer system 100 include estimation outputs 164.

2. Operation Methodology

Figure 2:
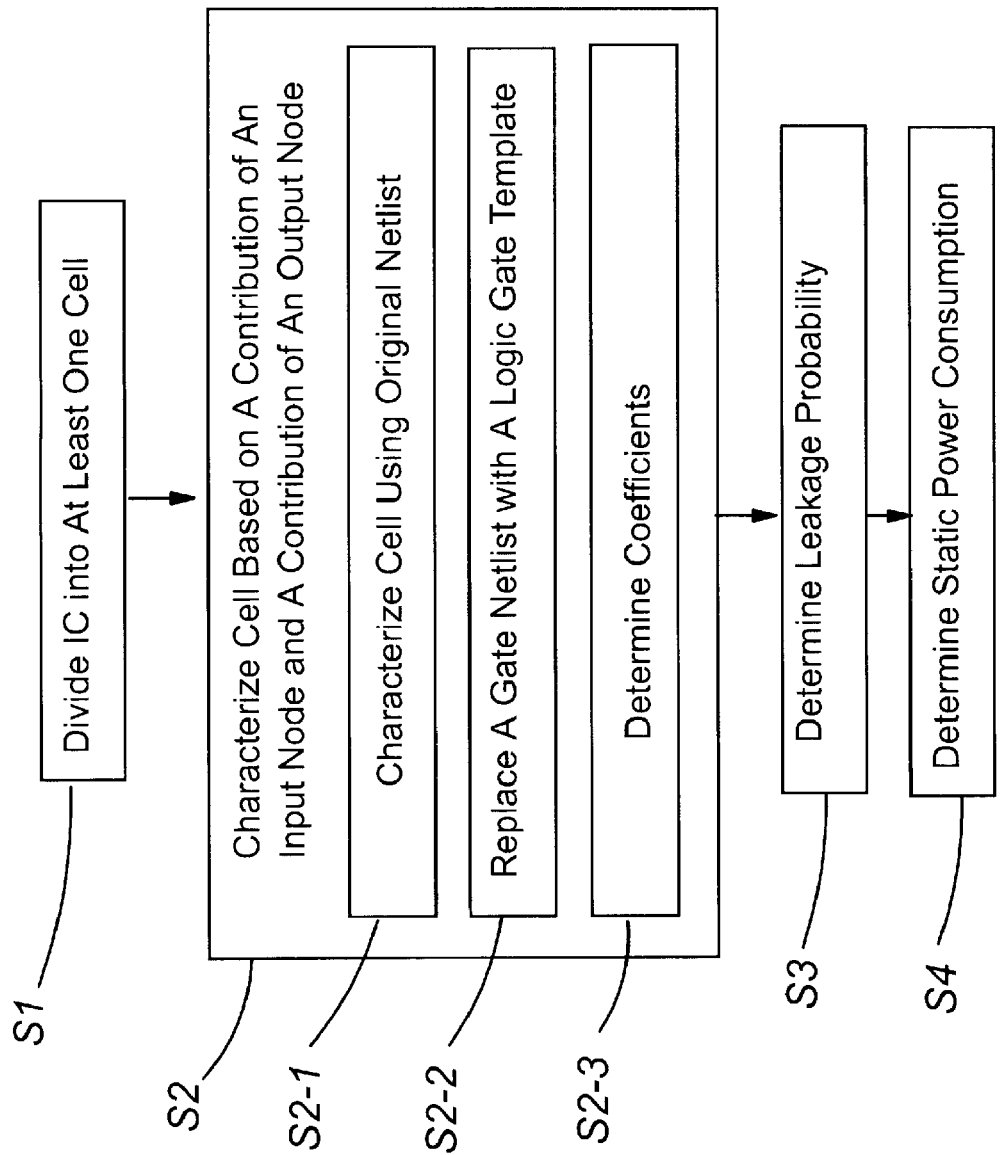
FIG. 2 shows a flow diagram of one embodiment of an operation of a static power consumption estimating system according to the invention.
Figure 3:
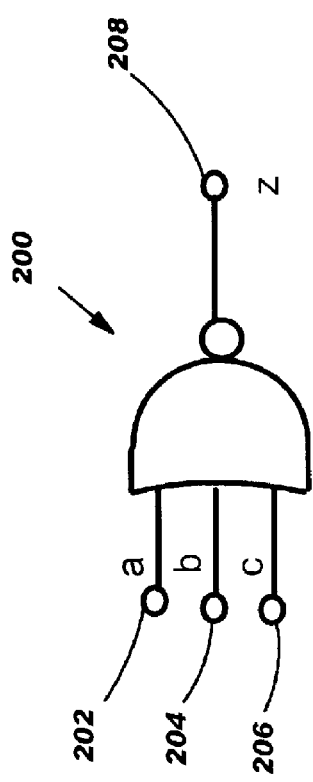
FIG. 3 shows an exemplary 3-input NAND cell, according to the invention.

FIG. 2 shows a flow diagram of one embodiment of an operation of static power consumption estimating system 132 according to the invention. To facilitate a description of the operation, FIG. 3 shows an exemplary 3-input NAND cell 200, hereinafter NAND 200, which will be operated upon by static power consumption estimating system 132.

Referring to FIGS. 1-2, in process S1, cell definer 141 divides a target IC into at least one cell(s). A cell may include any hierarchical level of IC components that is higher than the transistor level. A finer definition of cell/division of the IC may improve accuracy of the estimation, but may cost more computation resources. A user may instruct cell definer 141 regarding how to define a cell, based on, e.g., the requirement of a specific leakage estimation task. NAND 200 shown in FIG. 3 represents an illustrative example of a cell.

Next, in process S2, cell characterizer 142 characterizes a static power consumption of a cell based on a contribution of an input node and a contribution of an output node. Each contribution represents a multiplication of a coefficient and a leakage probability of a node. According to one embodiment, the following formula may be used for the characterization:

$$L_{stat,i} = a_{i,0} + \sum_{k=1...N} a_{i,k} p_{i,k} \qquad (1)$$

Where $L_{stat,i}$ denotes static power consumption (leakage) of cell i, $a_{i,0}$ denotes a coefficient constant of cell i, $a_{i,k}$ denotes a leakage coefficient of node k of cell i; and $p_{i,k}$ denotes a leakage probability of node k of cell i, i.e., the probability that node k of cell i is at logic "1". A leakage coefficient (hereinafter coefficient) represents a weighted value of a leakage of node k. As is appreciated, when a leakage happens, the amounts of leakage associated to different nodes are different. The leakage coefficients, i.e., weighted values, reflect such differences in leakage amounts. By using the leakage probabilities of nodes, instead of the complex Boolean expressions, to characterize the static power consumption of a cell, the total leakage calculation can be performed very efficiently as will be described later.

Process S2 may include three sub-processes. In process S2-1, cell characterizer 142 characterizes a cell using the original netlist of the cell. Specifically, with respect to NAND 200 (FIG. 3), for example, the characterization may be:

$$L_{stat} = a_0 + a_a p_a + a_b p_b + a_c p_c + a_z p_z$$

Where subscripts a, b, c refer to input nodes 202, 204, and 206, and subscript z refers to output node 208 of NAND 200.

In process S2-1, cell characterizer 142 also obtains, e.g., from data collector 140, the power dependency data, e.g., vectors, for a cell to facilitate further analysis of the characterization operation. Specifically, regarding NAND cell 200 (FIG. 3), it may be assumed for illustrative purposes that the following power dependency vectors are obtained:

TABLE 1

| Power Dependency of NAND 200 | | | | | | | | |
|---|---|---|---|---|---|---|---|---|
| a | 0 | 1 | 0 | 1 | 0 | 1 | 0 | 1 |
| b | 0 | 0 | 1 | 1 | 0 | 0 | 1 | 1 |
| c | 0 | 0 | 0 | 0 | 1 | 1 | 1 | 1 |
| Power | 1.1 | 1.4 | 0.9 | 0.3 | 3.1 | 3.3 | 4.5 | 6.3 |

Based on Table 1, the static power consumption (leakage) vector would be y={1, 1, 1.4, 0.9, 0.3, 3.1, 3.3, 4.5, 6.3}, while the smallest approximation base B would be:

B={{1, 1, 1, 1, 1, 1, 1, 1}, {0, 1, 0, 1, 0, 1, 0, 1}, {0, 0, 1, 1, 0, 0, 1, 1}, {0, 0, 0, 0, 1, 1, 1, 1}, {1, 1, 1, 1, 1, 1, 1, 0}}

The elements of B correspond to constant coefficient $a_0$, the input (a, b, c) vectors, and the output (z) vector of NAND 200 (FIG. 3). As is shown, a vector includes $2^n$ number of values, where n is the number of input nodes of a cell. NAND 200 (FIG. 3) includes three input nodes a, b and c (202, 204, 206). As such, a vector in base B includes 8 values.

Figure 4:
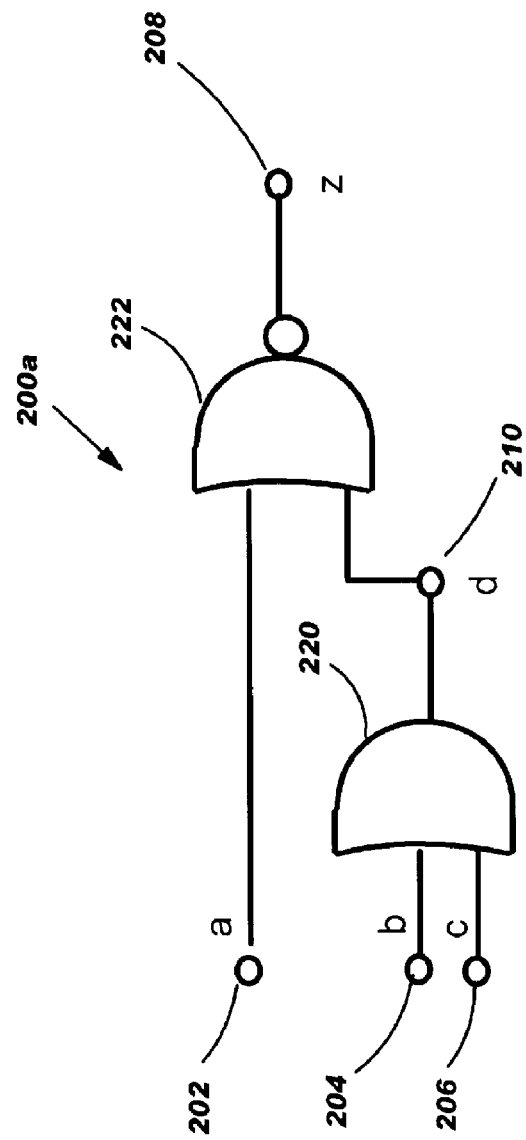
FIG. 4 shows a logically equivalent gate template (template) of the 3-input NAND cell of FIG. 3, according to one embodiment of the invention.

In process S2-2, optionally, template determination unit 144 replaces the gate netlist of the cell with a logically equivalent gate template, referred to as a logic gate template (or template) for simplicity purposes, by adding an internal node besides the input node(s) and the output node(s). The purposes of the replacement includes creating an internal node (nodes) to more accurately represent the static power consumption characteristic of the cell. The basic principle for the operation is that an internal node of a cell could affect the static power consumption, which may not be fully represented by the input and output vectors. According to one embodiment, the operation of process S2-2 only applies to a cell with three or more input nodes. FIG. 4 shows a logically equivalent gate template (template) 200a of NAND cell 200 of FIG. 3. As shown in FIG. 4, NAND cell 200 (FIG. 3) is logically equivalent to a 2-input AND gate 220 between, e.g., input nodes b (204) and c (206) with an internal output node d (210) and a 2-input OR gate 222 between, e.g., internal output node d (210) and input node a (202), which has output node z (208) (FIG. 4). It should be noted that logic template 200a of FIG. 4 is provided solely for illustration purposes, and does not limit the scope of the invention. For example, other combinations of input nodes a, b, c to form inputs to AND gate 220 and OR gate 222 are also possible. The specific logic gate template and the vector(s) to represent the additional internal node(s), e.g., node d, will be determined subsequently as will be described. To this extent, template 200a (FIG. 4) is an initial logic template of NAND 200 (FIG. 3) and needs to be finalized. In addition, the structure of the initial template may also be modified later, e.g., the number of internal nodes may be changed. The initial logic template may facilitate a selection of additional node vector(s) as will be described below.

After the logically equivalent template, e.g., 200a of FIG. 4, is initially created for NAND 200 (FIG. 3), additional node vector determination unit 145 determines an additional vector(s) corresponding to the additional node(s). According to one embodiment, additional node vector determination unit 145 determines a vector for the additional node that optimally represents the original cell (here NAND 200 of FIG. 3) regarding static power consumption. In addition, the final template is determined based on the selection of the additional node vector. It should be noted that any methods may be used in determining the optimal additional node(s) and the corresponding vector(s), and all are included in the invention.

According to one embodiment, additional node vector determination unit 145 determines the additional node vector(s) based on the following principles. In the general case, based on the template initially created, e.g., initial template 200a of FIG. 4 for NAND cell 200 of FIG. 3, one or more additional nodes may be added to the input and output nodes of the original netlist, e.g., NAND 200 of FIG. 3. Correspondingly, one or more vectors need to be added to the initial base B to generate an updated base B_U. Assume that a set of m possible different ways of creating internal nodes and the corresponding additional vectors could be added. Assume also that it is decided, e.g., by a user through instruction inputs 160 (FIG. 1) in the creation of the initial logic template, that a maximum of n internal nodes and vectors are desired to be added. In this case, there are $$\binom{m}{n}$$

possible alternatives to be considered by additional node vector determination unit 145. Similarly, there are totally $$\binom{m}{n}$$

possible alternative updated bases B_U.

According to one embodiment, for each of those $$\binom{m}{n}$$

possible alternative updated bases B_U, additional node vector determination unit 145 determines the error of each alternative updated base B_U, and thus the optimal alternative with the smallest error. Specifically, according to one embodiment, the additional vector/updated base B_U is determined such that a projection of the vector representing the static power consumption (leakage vector y) into an orthogonalization of the updated base B_U is higher than that into an alternative updated base B_U with an alternative additional vector.

It should be appreciated that any methods may be used to implement the above determination, and all are included in the invention. For example, from one iteration of error determination to another iteration, the updated base B_U may only change minimally such that incremental techniques may be used in determining the optimal vectors/updated base B_U. Specifically, there are at least three ways to implement the determination. One of them may be referred to as a simple orthogonalization method. Basically, the group of vectors to be considered during the seek of the logic gate-template are orthogonalized. The projection of leakage vector y over the orthogonalized group of vectors may determine the optimal template. For each iteration, a set of N orthogonalizations are required, with N being the number of vectors exchanged with respect to the previous base.

An alternative way to do the determination may be referred to as a QR decomposition method. It is similar to the simple orthogonalization approach, but uses a systematic decomposition approach. First, the updated base B_U with an initial set of vectors is created. Then, it is decomposed into an orthogonal matrix and an upper triangular matrix with a QR decomposition approach. Thus, $A=QR$ with $QQ^T=I$ and $R(i,j)=0$ for $i>j$. As used in the description, $Q^T$ is the transpose of matrix Q (similar denotation of superscript T is used for other matrixes in the description, e.g., $B^T$ is the transpose of matrix B). For each new group of vectors to be investigated, the QR decomposition is updated using given rotations, which is much more efficient than calculating a new QR decomposition. Provided in the following is an exemplary algorithm of the QR decomposition method:

---

```
Inputs: y =power leakage vector
n =number of additional vectos to add
t =type of cell (it is, AND, OR, etc)
Output: Bx_best =Boolean base of vectors for the approximation
alpha =coeficients for the characterization of the cell. err =
approximation error
//Initialization
B =Initial_set_of_vectors(t)
C =set_of_posible_vectors_to_add (t)
//First step
Bx {B, c1,c2,..,cn} //Initial base extended with n vectors
[Bx', Ri =qr(Bx) //Initial QR decompositon or Bx
k_best =norm( Bx'*y) //norm of the projection
//Loop
m =number_vectors (C)
for_each_combination (m, n) v=next_vector (C')
[Bx' R]= qr_update(Bx', R, v)
k =norm( BxI*y)
if k>k_best
k_best =k
Bx_best=Bx
//Final
alpha =solve_equation (Bx_best, y)
err =norm(y_alpha*Bx_best)
```

---

Some further explanation may help understand the QR decomposition method and the above algorithm. In the QR decomposition method, for a matrix of size N×N, computing a new QR factorization from scratch is roughly an $N^3$ algorithm, while simply updating the existing QR factors with one vector replaced requires $N^2$ operations. As such, the function qr_update can be used instead of qr, as shown by the algorithm above, for orthogonalizing the updated base B_U. After an initialization phase, the algorithm enters into a loop that covers each of the $$\binom{m}{n}$$

possible alternative updated bases B_U to analyze. For each alternative updated base B_U, the algorithm updates the QR decomposition. If the current updated base B_U is better than the previous best one, it is saved. Once the update best base B_U is obtained, the normal equations are solved to obtain the coefficients of the model and the error. If the error is too high, the procedure can be re-started with a larger value of n, i.e., modifying the initial logic template.

Another alternative way may be referred to as a normal equations update method. In this case, the normal equations are used directly. After calculating the first normal matrix $A=(B\_U)^T(B\_U)$, each new alternative updated base B_U is generated by updating and solving these normal equations. If the iteration over the group of vectors is done in such a way that only one vector is exchanged each time, the update of the normal matrix requires modifying only one single row and one single column of the previous matrix.

An example may be shown by applying the above methods to NAND 200 of FIG. 3. Corresponding to the initial template 200a of FIG. 4, an additional vector representing the internal node d may be added to the base B in order to improve the accuracy. If simple Boolean vectors are used, it is required that three vectors corresponding to AND gate 220 between two pins of NAND cell 200 (FIG. 3), e.g., b and c, and three vectors corresponding to OR gate 222 between two pins of NAND cell 200, e.g., a and b. Thus, the set of vectors to be analyzed is:

C={{0, 0, 0, 1, 0, 0, 0, 1}, {0, 0, 0, 0, 0, 1, 0, 1}, {0, 0, 0, 0, 0, 0, 1, 1}, {0, 1, 1, 1, 0, 1, 1, 1}, {0, 1, 0, 1, 1, 1, 1, 0}, {0, 0, 1, 1, 1, 1, 1, 1}}

Using the simple orthogonalization method, base B may be orthogonalized and normalized, and then, each one of the six additional vectors of C may be orthogonalized and normalized. C' may be used to refer to the new set of orthonormal vectors. Then, the projection of leakage vector y into the new orthogonal vectors of C' can be calculated. The one with the highest projection is the one which minimizes the error.

In the case of 3-input NAND cell 200 of FIG. 3, the orthogonalization of base B produces:

$$B' = \left\{ \frac{1}{\sqrt{8}}\{1, 1, 1, 1, 1, 1, 1, 1\}, \right.$$

$$\frac{1}{\sqrt{8}}\{-1, 1, -1, 1, -1, 1, -1, 1\}, \frac{1}{\sqrt{8}}\{-1, -1, 1, 1, -1, -1, 1, 1\},$$

$$\left. \frac{1}{\sqrt{8}}\{-1, -1, -1, -1, 1, 1, 1, 1\}, \frac{1}{\sqrt{8}}\{1, 0, 0, -1, 0, -1, -1, 2\} \right\}$$

Starting with the first vector of C, {0, 0, 0, 1, 0, 0, 0, 1}, orthogonalizing with B' we get the normal vector c1'={-1, 2, 2, -3, -2, 1, 1, 0}. The length of the projection of the leakage vector y={1.1, 1.4, 0.9, 0.3, 3.1, 3.3, 4.5, 6.3} on c1' is 0.86. Repeating the same operations for the second vector of C, a projection length of 0.21 can be obtained. After computing the metric for all the six vectors of C, the highest value is obtained for the vector {0, 0, 0, 0, 0, 0, 1, 1}. It corresponds to an AND gate between input nodes b (204) and c (206) (FIG. 3), and thus, this is the optimal internal node d and the optimal logic gate-template.

After the optimal logic gate-template is determined, cell characterizer 142 characterizes the static power consumption of the cell using the new template. Specifically, for NAND 200 (FIG. 3), the new characterization may be:

$$L'_{stat} = a_0 + a_d p_a + a_b p_b + a_c p_c + a_d p_d + a_z p_z$$

In process S2-3, coefficient determination unit 143 determines the coefficient for each node in the cell characterization. It is appreciated that any method may be used to obtain the values for coefficients $a_{i,0}$, $a_{i,k}$ in formula (1) and all are included in the invention. According to one embodiment, the determination may be done in two processes. First, a table-based description of the leakage of a cell is obtained by means of, e.g., an exhaustive SPICE simulation, as shown in table (1). Next, the information may be analyzed to construct a cell characterization coefficient represented by $a_{i,0}$, $a_{i,k}$ of formula (1). An advantage of this characterization method is that it provides a better insight about the cost associated with the leakage probability of each node. Thus, some optimization techniques such as pin-reordering can be more efficiently performed.

As is known in the art, if base B (or B_U) is given, coefficients $a_k$ of formula (1), which minimize the mean squared error, are simply the coordinates of an orthogonal projection of the leakage vector y into base B. For example, the following formula may be used to obtain coefficients $a_{i,k}$:

$$B^T Ba = B^T y \qquad (2)$$

Applying B to formula (2), it can be obtained that $a_k = \{3.825, -0.275, 0.075, 2.675, -2.8\}$. Applying $a_k$ to formula (1), it can be obtained that the best approximation of the static power consumption of NAND 200 (FIG. 3) using the original netlist of input and output nodes is:

$$L_{stat} \approx 3.825 - 0.275 P_a + 0.075 P_b + 2.675 P_c - 2.8 P_z$$

If a logic gate template is determined in the optional process S2-2, the updated base B_U will be used to determine a coefficient and a probability (as will be described later) of a node of the logic gate template. With the previously calculated logic gate-template B_U, using the same method, the following approximation can be obtained for the static power consumption of NAND 200 (FIG. 3) using the template of FIG. 4:

$$L_{stat} \approx 3.1 - 0.03Pa - 0.65Pb + 1.95Pc - 1.83Pz + 1.93Pd$$

where Pd is leakage probability of additional internal node d 220 (FIG. 4).

In process S3, leakage probability determination unit 146 determines a value of the leakage probability ($P_K$) of each node in a cell. Any now known or later developed method may be used in the determination and all are included in the invention.

In process S4, static power consumption calculator 148 determines a static power consumption of a cell to determine the static power consumption of the integrated circuit. According to one embodiment, for each cell j, static power calculator 148 applies $a_{i,0}$ (coefficient constant), $a_{i,k}$ (coefficient for node k of cell i); and $p_{i,k}$ (leakage probability of node k of cell i) into formula (1) to determine the static power consumption of the cell. Adding static power consumption of all cells, static power consumption calculator 148 may obtain the static power consumption of the integrated circuit.

3. Conclusion

While shown and described herein as a method and system for estimating a static power consumption of an integrated circuit, it is understood that the invention further provides various alternative embodiments. For example, in one embodiment, the invention provides a program product stored on a computer-readable medium, which when executed, enables a computer infrastructure to estimate a static power consumption of an integrated circuit. To this extent, the computer-readable medium includes program code, such as static power consumption estimating system 132 (FIG. 1), which implements the process described herein. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computing device, such as memory 120 (FIG. 1) and/or database 128 (FIG. 1), and/or as a data signal traveling over a network (e.g., during a wired/wireless electronic distribution of the program product).

In another embodiment, the invention provides a method of generating a system for estimating a static power consumption of an integrated circuit. In this case, a computer infrastructure, such as computer system 100 (FIG. 1), can be obtained (e.g., created, maintained, having made available to, etc.) and one or more systems for performing the process described herein can be obtained (e.g., created, purchased, used, modified, etc.) and deployed to the computer infrastructure. To this extent, the deployment of each system can comprise one or more of: (1) installing program code on a computing device, such as computing system 100 (FIG. 1), from a computer-readable medium; (2) adding one or more computing devices to the computer infrastructure; and (3) incorporating and/or modifying one or more existing systems of the computer infrastructure, to enable the computer infrastructure to perform the process processes of the invention.

In still another embodiment, the invention provides a business method that performs the process described herein on a subscription, advertising supported, and/or fee basis. That is, a service provider could offer to estimate a static power consumption of an integrated circuit as described herein. In this case, the service provider can manage (e.g., create, maintain, support, etc.) a computer infrastructure, such as computer system 100 (FIG. 1), that performs the process described herein for one or more customers and communicates the results of the determination of the relative amount of usage of a data retaining device to the one or more customers. In return, the service provider can receive payment from the customer(s) under a subscription and/or fee agreement and/or the service provider can receive payment from the sale of advertising to one or more third parties.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The flowcharts and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, processes, operations, elements, and/or components, but do not preclude the presence or addition of one or more other features, integers, processes, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A method for estimating a static power consumption of an integrated circuit, the method comprising:
   dividing the integrated circuit into at least one cell;
   characterizing a static power consumption of the at least one cell based on a contribution of at least one input node and a contribution of at least one output node of the cell, each contribution representing a multiplication of a leakage coefficient and a probability of the at least one input node and the at least one output node;
   determining a value of the leakage coefficient of the at least one input node and the at least one output node;
   determining a value of the probability of the at least one input and at least one output node; and
   calculating the static power consumption of the cell to determine the static power consumption of the integrated circuit using a computer;
   wherein the leakage coefficient of the at least one input node and at least one output node is determined as a coordinate of an orthogonal projection of a vector representing the static power consumption of the cell into a base of vectors representing the at least one input node, the at least one output node and a constant; and
   replacing a gate netlist of the cell with a logic gate template by adding an internal node besides the input node and the output node of the cell.

2. The method of claim 1, where a vector includes $2^n$ numbers of values, where n denotes a number of inputs of a cell.

3. The method of claim 1, wherein a leakage coefficient of a node is determined based on the following formula:

$$B^TBa=B^Ty$$

where B denotes the base as a matrix, $B^T$ denotes a transpose of matrix B, y denotes the vector representing the static power consumption, and a denotes the leakage coefficient.

4. The method of claim 1, wherein an additional vector corresponding to the added internal node is added to the base to generate an updated base.

5. The method of claim 4, wherein the updated base is used to determine a leakage coefficient and a leakage probability of a node of the logic gate template.

6. The method of claim 5, wherein the additional vector is determined such that a projection of the vector representing the static power consumption of the cell into an orthogonalization of the updated base is higher than that into an alternative updated base with an alternative additional vector.

7. A system for estimating a static power consumption of an integrated circuit, the system comprising:
   means for dividing the integrated circuit into at least one cell;
   means for characterizing a static power consumption of a cell based on a contribution of at least one input node and a contribution of at least one output node of the cell, each contribution representing a multiplication of a leakage coefficient and a probability of the at least one input node and the at least one output node;
   means for determining a value of the leakage coefficient of the at least one input node and the at least one output node based on the following formula:

$$B^TBa=B^Ty$$

where B denotes the base as a matrix, $B^T$ denotes a transpose of matrix B, y denotes the vector representing the static power consumption, and a denotes the leakage coefficient;
   means for determining a value of the probability of the at least one input and at least one output node; and
   means for calculating the static power consumption of the cell to determine the static power consumption of the integrated circuit;
   wherein the leakage coefficient of the at least one input node and the at least one output node is determined as a coordinate of an orthogonal projection of a vector representing the static power consumption of the cell into a base of vectors representing the at least one input node, the at least one output node and a constant.

8. The system of claim 7, where a vector includes $2^n$ numbers of values, where n denotes a number of inputs of a cell.

9. The system of claim 7, further comprising means for replacing a gate netlist of the cell with a logic gate template by adding an internal node besides the input node and the output node of the cell.

10. The system of claim 9, wherein the replacing means adds an additional vector corresponding to the added internal node to the base to generate an updated base.

11. The system of claim 10, wherein the updated base is used to determine a leakage coefficient and a leakage probability of a node of the logic gate template.

12. The system of claim 10, wherein the additional vector is determined such that a projection of the vector representing the static power consumption of the cell into an orthogonalization of the updated base is higher than that into an alternative updated base with an alternative additional vector.

13. A computer program product comprising:
   computer readable program code stored in a computer readable storage device, the computer readable program code, when executed by a computer system, is configured to:
   divide an integrated circuit into at least one cell;
   characterize a static power consumption of a cell based on a contribution of at least one input node and a contribution of at least one output node of the cell, each contribution representing a multiplication of a leakage coefficient and a probability of the at least one input node and the at least one output node;

determine a value of the leakage coefficient of the at least one input and at least one output node;

determine a value of a probability of the at least one input and at least one output node; and calculate the static power consumption of the cell to determine the static power consumption of the integrated circuit;

wherein the leakage coefficient of the at least one input node and the at least one output node is determined as a coordinate of an orthogonal projection of a vector representing the static power consumption of the cell into a base of vectors representing the at least one input node, the at least one output node and a constant; and replace a gate netlist of the cell with a logic gate template by adding an internal node besides the at least one input node and the at least one output node of the cell.

14. The program product of claim 13, where a vector includes $2^n$ numbers of values, where n denotes a number of inputs of a cell.

15. The program product of claim 13, wherein a leakage coefficient of the at least one input node and the at least one output node is determined based on the following formula:

$$B^T B a = B^T y$$

where B denotes the base as a matrix, $B^T$ denotes a transpose of matrix B, y denotes the vector representing the static power consumption, and a denotes the leakage coefficient.

16. The program product of claim 13, wherein the computer usable program code is further configured to add an additional vector corresponding to the added internal node to the base to generate an updated base, the updated base being used to determine a leakage coefficient and a leakage probability of a node of the logic gate template.

17. The program product of claim 16, wherein the additional vector is determined such that a projection of the vector representing the static power consumption of the cell into an orthogonalization of the updated base is higher than that into an alternative updated base with an alternative additional vector.

* * * * *